US012562707B2

(12) United States Patent
Liu et al.

(10) Patent No.: US 12,562,707 B2
(45) Date of Patent: Feb. 24, 2026

(54) ANTENNA IMPEDANCE MATCHING DESIGN CIRCUIT AND NEAR-FIELD COMMUNICATION CIRCUIT SYSTEM

(71) Applicants:Beijing BOE Display Technology Co., Ltd., Beijing (CN); BOE Technology Group Co., Ltd., Beijing (CN)

(72) Inventors: Yujie Liu, Beijing (CN); Xiuyun Chen, Beijing (CN); Feng Long, Beijing (CN); Dapeng Liang, Beijing (CN); Shuwei Guo, Beijing (CN); Zixuan Bai, Beijing (CN); Jing Zhao, Beijing (CN); Meng Shi, Beijing (CN); Chao Huang, Beijing (CN); Yeyu Feng, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 18/580,178

(22) PCT Filed: Mar. 23, 2022

(86) PCT No.: PCT/CN2022/082579
§ 371 (c)(1),
(2) Date: Jan. 18, 2024

(87) PCT Pub. No.: WO2023/178563
PCT Pub. Date: Sep. 28, 2023

(65) Prior Publication Data
US 2024/0333246 A1      Oct. 3, 2024

(51) Int. Cl.
*H03H 7/38*          (2006.01)
*H01Q 7/00*          (2006.01)
(Continued)

(52) U.S. Cl.
CPC ................ *H03H 7/38* (2013.01); *H01Q 7/00* (2013.01); *H03H 7/0115* (2013.01); *H04B 5/20* (2024.01); *H04B 5/43* (2024.01); *H04B 5/40* (2024.01)

(58) Field of Classification Search
None
See application file for complete search history.

(56) References Cited

U.S. PATENT DOCUMENTS 10,430,784 B1 * 10/2019 He ........................... H01Q 1/38
2015/0031315 A1 * 1/2015 Pieber ...................... H04B 1/44
455/78

(Continued)

FOREIGN PATENT DOCUMENTS

CN           104348515 A       2/2015
CN           106982076 A       7/2017
(Continued)

OTHER PUBLICATIONS

International Search Report and Written Opinion mailed on Nov. 23, 2022, in corresponding PCT/CN2022/082579, 8 pages.

*Primary Examiner* — Anh Q Tran
(74) *Attorney, Agent, or Firm* — XSENSUS LLP

(57)          ABSTRACT

An antenna impedance matching design circuit includes a load circuit, a filter circuit and a matching circuit which are connected to each other. The load circuit is connected to one end of the filter circuit for connecting a near field communication chip, and the matching circuit includes a plurality of capacitors.

13 Claims, 4 Drawing Sheets

(51) Int. Cl.

| | | |
|---|---|---|
| *H03H 7/00* | (2006.01) | |
| *H03H 7/01* | (2006.01) | |
| *H04B 5/20* | (2024.01) | |
| *H04B 5/40* | (2024.01) | |
| *H04B 5/43* | (2024.01) | |

(56)  References Cited

U.S. PATENT DOCUMENTS

| | | | | |
|---|---|---|---|---|
| 2016/0028446 | A1 | 1/2016 | Moon et al. | |
| 2016/0315667 | A1* | 10/2016 | Jensen | H04B 5/72 |
| 2018/0269560 | A1 | 9/2018 | Ding et al. | |
| 2019/0149196 | A1* | 5/2019 | Hueber | H03B 5/1203 |
| | | | | 340/10.1 |

FOREIGN PATENT DOCUMENTS

| | | | |
|---|---|---|---|
| CN | 108288758 | A | 7/2018 |
| CN | 108737999 | A | 11/2018 |
| CN | 109327245 | A | 2/2019 |
| CN | 113690638 | A | 11/2021 |
| EP | 2830228 | A1 | 1/2015 |
| EP | 3376680 | A1 | 9/2018 |
| JP | 2016-029577 | A | 3/2016 |
| KR | 2016-0014191 | A | 2/2016 |

* cited by examiner

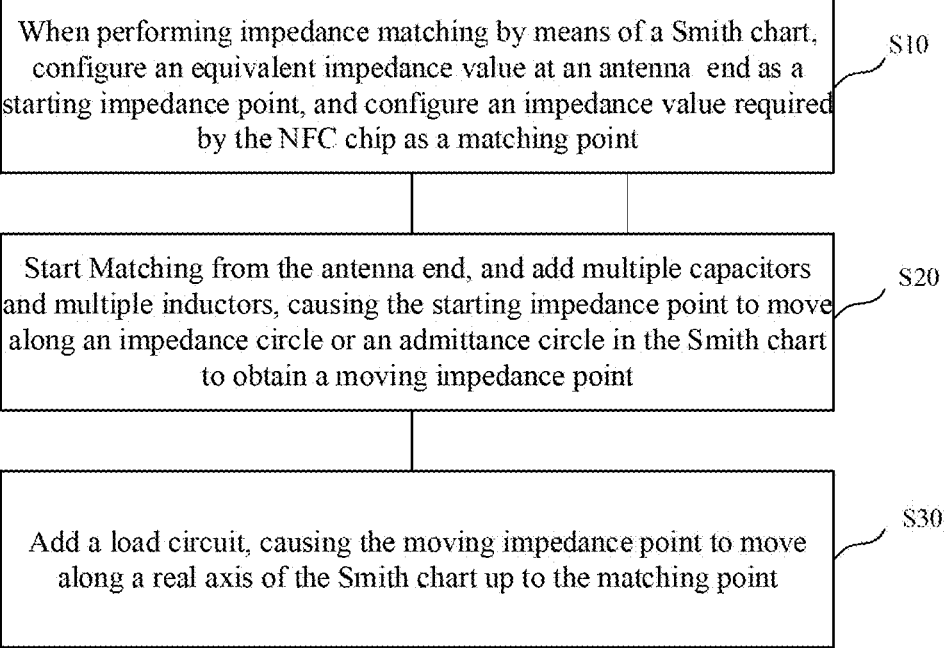

When performing impedance matching by means of a Smith chart, configure an equivalent impedance value at an antenna end as a starting impedance point, and configure an impedance value required by the NFC chip as a matching point          S10

Start Matching from the antenna end, and add multiple capacitors and multiple inductors, causing the starting impedance point to move along an impedance circle or an admittance circle in the Smith chart to obtain a moving impedance point          S20

Add a load circuit, causing the moving impedance point to move along a real axis of the Smith chart up to the matching point          S30

FIG. 7

ANTENNA IMPEDANCE MATCHING DESIGN CIRCUIT AND NEAR-FIELD COMMUNICATION CIRCUIT SYSTEM

CROSS-REFERENCE TO RELATED APPLICATION

This disclosure is the U.S. national phase application of PCT Application No. PCT/CN2022/082579, filed Mar. 23, 2022 and titled "ANTENNA IMPEDANCE MATCHING DESIGN CIRCUIT AND NEAR-FIELD COMMUNICA-TION CIRCUIT SYSTEM", the entire content of which is incorporated herein by reference.

TECHNICAL FIELD

This disclosure relates to the field of wireless communi-cation technology, and in particular to an antenna impedance matching design circuit and a near field communication circuit system.

BACKGROUND

Near Field Communication (NFC) is a wireless commu-nication technology that operates at 13.56 MHz and is used for short-range secure communication. It enables mobile terminals to implement mobile payment, electronic ticket-ing, access control, mobile identity recognition, anti-coun-terfeiting and other applications.

In the NFC technology, when the resistance of the signal source is the same as the load resistance, the maximum power output can be obtained at the output end. NFC antenna is an indispensable component in the NFC technol-ogy. In related art, circuits that adjust impedance match for NFC antennas cannot meet the needs of all NFC antennas.

The above information disclosed in this background sec-tion is only for enhancing understanding of the context of the disclosure and therefore it may contain information that does not form the prior art that is already known to those skilled in the art.

SUMMARY

This disclosure is directed to provide an antenna imped-ance matching design circuit and an NFC circuit system, so as to solve the impedance matching problem of high-impedance antenna, thereby optimizing the reflection coef-ficient of the design circuit while satisfying the forward transmission coefficient and achieving the best matching degree for the antenna.

In order to achieve the above-mentioned object of the invention, this disclosure adopts the following technical solutions.

According to a first aspect of this disclosure, an antenna impedance matching design circuit is provided and includes a load circuit, a filter circuit and a matching circuit con-nected to each other, where the load circuit is connected to an end of the filter circuit for connecting to an NFC chip, and the matching circuit includes a plurality of capacitors.

In an exemplary embodiment of this disclosure, the load circuit and the filter circuit are connected in series.

In an exemplary embodiment of this disclosure, the load circuit includes a first resistor and a second resistor;

a first end of the first resistor is configured to be connected to a signal transmitting end of the NFC chip, and a second end of the first resistor is connected to the filter circuit;

a first end of the second resistor is configured to be connected to the signal transmitting end of the NFC chip, and a second end of the second resistor is con-nected to the filter circuit.

In an exemplary embodiment of this disclosure, the filter circuit includes a first inductor, a first capacitor, a second inductor and a second capacitor;

a first end of the first inductor is connected to the second end of the first resistor, and a second end of the first inductor is connected to a first end of the first capacitor;

a first end of the second inductor is connected to the second end of the second resistor, and a second end of the second inductor is connected to a first end of the second capacitor;

a second end of the first capacitor is connected to a second end of the second capacitor and then connected to ground.

In an exemplary embodiment of this disclosure, the matching circuit includes a third capacitor, a fourth capaci-tor, a fifth capacitor and a sixth capacitor;

a first end of the third capacitor is connected to the first end of the first capacitor, and a second end of the third capacitor is connected to a first end of the fifth capaci-tor;

a first end of the fourth capacitor is connected to the first end of the second capacitor, and a second end of the fourth capacitor is connected to a first end of the sixth capacitor;

a second end of the fifth capacitor is connected to a second end of the sixth capacitor and connected to the second end of the first capacitor;

the first end of the fifth capacitor and the first end of the sixth capacitor are configured to be connected to an antenna.

According to a second aspect of this disclosure, an NFC circuit system is provided and includes:

an antenna;

an NFC chip circuit including an NFC chip; and the design circuit according to the first aspect, where the design circuit is connected between a signal transmit-ting end of the NFC chip and the antenna, and is configured to adjust impedance match for the antenna; the load circuit is connected between the signal transmit-ting end of the NFC chip and the filter circuit.

In an exemplary embodiment of this disclosure, the signal transmitting end includes a first signal transmitting end and a second signal transmitting end;

when the load circuit includes a first resistor and a second resistor, a first end of the first resistor is connected to the first signal transmitting end, and a first end of the second resistor is connected to the second signal trans-mitting end.

In an exemplary embodiment of this disclosure, the NFC chip circuit further includes a receiving circuit, the receiving circuit is connected between a signal receiving end of the NFC chip and the antenna;

the signal receiving end includes a first signal receiving end and a second signal receiving end;

the receiving circuit includes a seventh capacitor, an eighth capacitor, a third resistor and a fourth resistor;

a first end of the seventh capacitor is connected to the first signal receiving end, and a second end of the seventh capacitor is connected to a first end of the third resistor;

a first end of the eighth capacitor is connected to the second signal receiving end, and a second end of the eighth capacitor is connected to a first end of the fourth resistor;

a second end of the third resistor is connected to a first end of the antenna, and a second end of the fourth resistor is connected to a second end of the antenna.

In an exemplary embodiment of this disclosure, an NFC circuit system includes:

an antenna;

an NFC chip circuit including the NFC chip; and the design circuit according to the first aspect, where the design circuit is connected between the signal transmitting end of the NFC chip and the antenna, and is configured to adjust impedance match for the antenna;

the load circuit is connected between the signal transmitting end of the NFC chip and the filter circuit;

where the NFC chip, the load circuit and the filter circuit form a first circuit, and the antenna and the matching circuit form a second circuit;

a first single-ended impedance of the first circuit and a second single-ended impedance of the second circuit are conjugate impedances.

In an exemplary embodiment of this disclosure, a resistance value of the first resistor is equal to a resistance value of the second resistor, an inductance value of the first inductor is equal to an inductance value of the second inductor, and a capacitance value of the first capacitor is equal to a capacitance value of the second capacitor;

the first single-ended impedance of the first circuit satisfies a following equation:

$$Z_{tr} = \frac{\left(\dfrac{R_{match}}{2} + R_{1,2}\right) + j\omega L_{1,2}\right) \cdot \left(-j\dfrac{1}{\omega C_{1,2}}\right)}{\left(\dfrac{R_{match}}{2} + R_{1,2}\right) + j\left(\omega L_{1,2} - \dfrac{1}{\omega C_{1,2}}\right)}$$

where $Z_{tr}$ denotes the first single-ended impedance; $R_{match}$ denotes a resistance value required by the signal transmitting end of the NFC chip; $R_{1,2}$ denotes the resistance value of the first resistor or the second resistor; j denotes an imaginary unit; $\omega$ denotes an angular frequency; $C_{1,2}$ denotes the capacitance value of the first capacitor or the second capacitor; and $L_{1,2}$ denotes the inductance value of the first inductor or the second inductor.

In an exemplary embodiment of this disclosure, a capacitance value of the third capacitor is equal to a capacitance value of the fourth capacitor; a capacitance value of the fifth capacitor is equal to a capacitance value of the sixth capacitor; and the second single-ended impedance of the second circuit satisfies a following equation:

$$Z_{tr}^* = \frac{(R_{pa} + j\omega L_{pa}) \cdot \left(-j\dfrac{1}{\omega C_0}\right)}{R_{pa} + j\left(\omega L_{pa} - \dfrac{1}{\omega C_0}\right)} \quad \text{where}$$

$$C_0 = \frac{C_{3,4}(C_{5,6} + C_{pa})}{C_{3,4} + C_{5,6} + C_{pa}};$$

$Z_{tr}^*$ denotes the second single-ended impedance; $R_{pa}$ denotes a resistance value corresponding to half of an antenna-end equivalent impedance value; $L_{pa}$ denotes an inductance value corresponding to half of the antenna-end equivalent impedance value; $C_{pa}$ denotes a capacitance value corresponding to half of the antenna-end equivalent impedance value; $C_{3,4}$ denotes the capacitance value of the third capacitor or the fourth capacitor; $C_{5,6}$ denotes the capacitance value of the fifth capacitor or the sixth capacitor.

According to a third aspect of this disclosure, an NFC impedance matching method is provided and includes:

obtaining a first single-ended impedance of a first circuit, where the first circuit includes an NFC chip, a load circuit and a filter circuit, and the load circuit is connected between a signal transmitting end of the NFC chip and the filter circuit;

obtaining a second single-ended impedance of a second circuit, where the second circuit includes an antenna and a matching circuit, and the matching circuit is connected between the filter circuit and the antenna;

matching the first single-ended impedance with the second single-ended impedance in such a manner that the first single-ended impedance and the second single-ended impedance are conjugate impedances.

In an exemplary embodiment of this disclosure, the load circuit is connected in series between the signal transmitting end of the NFC chip and the filter circuit.

In an exemplary embodiment of this disclosure, the signal transmitting end includes a first signal transmitting end and a second signal transmitting end;

the load circuit includes a first resistor and a second resistor;

a first end of the first resistor is connected to the first signal transmitting end, and a second end of the first resistor is connected to the filter circuit;

a first end of the second resistor is connected to the second signal transmitting end, and a second end of the second resistor is connected to the filter circuit.

In an exemplary embodiment of this disclosure, the filter circuit includes a first inductor, a first capacitor, a second inductor and a second capacitor;

a first end of the first inductor is connected to the second end of the first resistor, and a second end of the first inductor is connected to a first end of the first capacitor;

a first end of the second inductor is connected to the second end of the second resistor, and a second end of the second inductor is connected to a first end of the second capacitor;

a second end of the first capacitor is connected to a second end of the second capacitor and then connected to ground;

where a resistance value of the first resistor is equal to a resistance value of the second resistor, an inductance value of the first inductor is equal to an inductance value of the second inductor, and a capacitance value of the first capacitor is equal to a capacitance value of the second capacitor; and the first single-ended impedance satisfies a following equation:

$$Z_{tr} = \frac{\left(\dfrac{R_{match}}{2} + R_{1,2}\right) + j\omega L_{1,2}\right) \cdot \left(-j\dfrac{1}{\omega C_{1,2}}\right)}{\left(\dfrac{R_{match}}{2} + R_{1,2}\right) + j\left(\omega L_{1,2} - \dfrac{1}{\omega C_{1,2}}\right)}$$

where $Z_{tr}$ denotes the first single-ended impedance; $R_{match}$ denotes a resistance value required by the signal transmitting end of the NFC chip; $R_{1,2}$ denotes the resistance value of the first resistor or the second resistor; j denotes an imaginary unit; $\omega$ denotes an angular frequency; $C_{1,2}$ denotes the capacitance value of the first capacitor or the second capacitor; and $L_{1,2}$ denotes the inductance value of the first inductor or the second inductor.

In an exemplary embodiment of this disclosure, the matching circuit includes a third capacitor, a fourth capacitor, a fifth capacitor and a sixth capacitor;

a first end of the third capacitor is connected to the first end of the first capacitor, and a second end of the third capacitor is connected to a first end of the fifth capacitor;

a first end of the fourth capacitor is connected to the first end of the second capacitor, and a second end of the fourth capacitor is connected to a first end of the sixth capacitor;

a second end of the fifth capacitor is connected to a second end of the sixth capacitor and connected to the second end of the first capacitor;

a first end of the antenna is connected to the first end of the fifth capacitor, and a second end of the antenna is connected to the first end of the sixth capacitor;

where a capacitance value of the third capacitor is equal to a capacitance value of the fourth capacitor; a capacitance value of the fifth capacitor is equal to a capacitance value of the sixth capacitor; and the second single-ended impedance satisfies a following equation:

$$Z_{tr}^* = \frac{(R_{pa} + j\omega L_{pa}) \cdot \left(-j\frac{1}{\omega C_0}\right)}{R_{pa} + j\left(\omega L_{pa} - \frac{1}{\omega C_0}\right)}$$

$$\text{where } C_0 = \frac{C_{3,4}(C_{5,6} + C_{pa})}{C_{3,4} + C_{5,6} + C_{pa}};$$

$Z_{tr}^*$ denotes the second single-ended impedance; $R_{pa}$ denotes a resistance value corresponding to half of an antenna-end equivalent impedance value; $L_{pa}$ denotes an inductance value corresponding to half of the antenna-end equivalent impedance value; $C_{pa}$ denotes a capacitance value corresponding to half of the antenna-end equivalent impedance value; $C_{3,4}$ denotes the capacitance value of the third capacitor or the fourth capacitor; $C_{5,6}$ denotes the capacitance value of the fifth capacitor or the sixth capacitor.

In an exemplary embodiment of this disclosure, an NFC impedance matching method includes:

configuring, upon performing impedance matching by means of a Smith chart, an equivalent impedance value at an antenna end as a starting impedance point, and configuring an impedance value required by an NFC chip as a matching point;

starting matching from the antenna end, adding multiple capacitors and multiple inductors, causing the starting impedance point to move along an impedance circle or an admittance circle in the Smith chart to obtain a moving impedance point; and adding a load circuit, causing the moving impedance point to move along a real axis of the Smith chart up to the matching point.

In an exemplary embodiment of this disclosure, starting matching from the antenna end, adding the multiple capacitors and the multiple inductors, causing the starting impedance point to move along the impedance circle or the admittance circle in the Smith chart to obtain the moving impedance point includes:

adding a fifth capacitor, causing the starting impedance point to rotate clockwise along a constant admittance circle to a first moving impedance point;

adding a third capacitor, causing the first moving impedance point to rotate counterclockwise along a constant impedance circle to a second moving impedance point;

adding a first capacitor, causing the second moving impedance point to rotate clockwise along the constant admittance circle to a third moving impedance point; and adding a first inductor, causing the third moving impedance point to rotate clockwise along the constant impedance circle to the moving impedance point.

In an exemplary embodiment of this disclosure, upon adding the load circuit, the moving impedance point moves along a circle with low constant impedance toward a circle with high impedance.

According to a fourth aspect of this disclosure, a display device is provided and includes the NFC circuit system according to the second aspect.

According to the antenna impedance matching design circuit provided by this disclosure, a load circuit is connected between the signal transmitting end of the NFC chip and the filter circuit. This solution can solve the impedance matching problem of high-impedance antenna, thereby optimizing the reflection coefficient of the design circuit while satisfying the forward transmission coefficient and achieving the best matching degree for the antenna.

BRIEF DESCRIPTION OF THE DRAWINGS

The above and other features and advantages of this disclosure will become more apparent by describing in detail exemplary embodiments thereof with reference to the accompanying drawings.

FIG. 7 is another flow chart of an NFC impedance matching method according to some embodiments of this disclosure.

DETAILED DESCRIPTION

Figure 1:
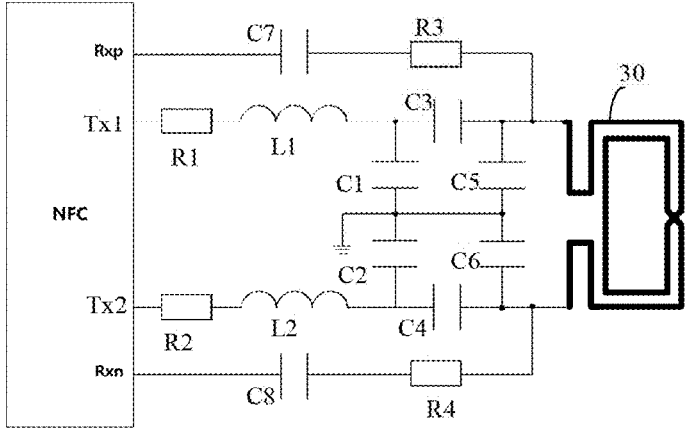
FIG. 1 is a schematic structural diagram of an NFC circuit system according to some embodiments of this disclosure.

Exemplary embodiments will now be described more fully with reference to the accompanying drawings. Exemplary embodiments may, however, be embodied in various forms and should not be construed as limited to the examples set forth herein. Rather, these embodiments are provided so that this disclosure will be thorough and complete and will fully convey the concepts of the exemplary embodiments to those skilled in the art. The described features, structures or characteristics may be combined in any suitable manner in one or more embodiments. In the following description, numerous specific details are described to provide a thorough understanding of embodiments of this disclosure.

In the drawings, regions and layer thicknesses may be exaggerated for clarity. The same reference numerals in the drawings represent the same or similar structures, and thus their detailed descriptions may be omitted.

The described features, structures or characteristics may be combined in any suitable manner in one or more embodiments. In the following description, numerous specific details are described to provide a thorough understanding of embodiments of this disclosure. However, those skilled in the art will appreciate that the technical solutions of this disclosure may be practiced without one or more of the specific details described, or other methods, components, materials, etc. may be employed. In other instances, well-known structures, materials, or operations are not shown or described in detail to avoid obscuring the main technical ideas of the disclosure.

When a structure is "on" another structure, it may mean that the structure is integrally formed on the another structure, or that the structure is "directly" placed on the another structure, or that the structure is "indirectly" placed on the another structure through yet another structure.

The terms "a", "an" and "the" are used to indicate the existence of one or more elements/components/etc.; the terms "comprise/include" and "have" are used to indicate an open-ended inclusive meaning and refer to possible existence of additional elements/components/etc. in addition to those listed. The terms "first" and "second" etc. are used merely as labels without applying quantitative limitations to their objects.

In the related art, the design circuit for adjusting impedance match for the NFC antenna typically includes a resistor connected in series with the antenna, and achieves impedance match by matching the capacitance value in the matching circuit. However, this matching manner is only applicable when the impedance of the antenna itself is relatively small. When the impedance of the antenna is relatively large, a good matching effect cannot be achieved.

Figure 2:
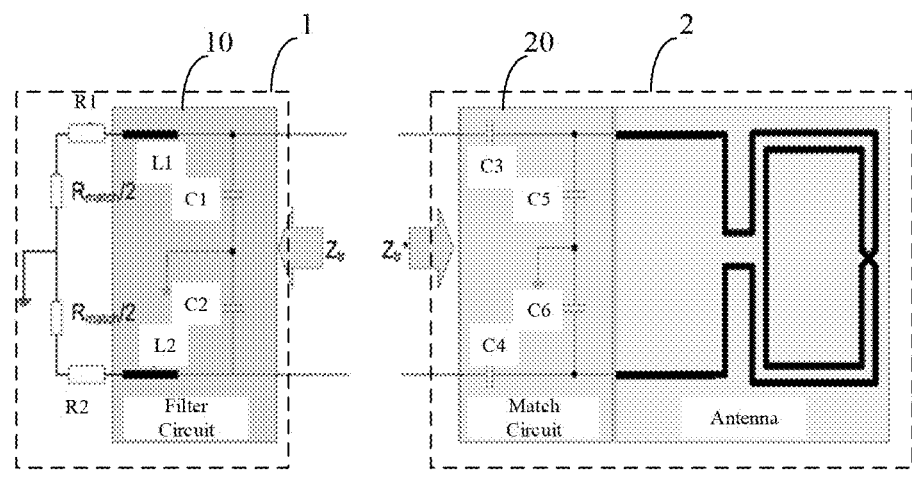
FIG. 2 is another structural schematic diagram of an NFC circuit system according to some embodiments of this disclosure.

As shown in FIG. 1 and FIG. 2, some embodiments of this disclosure provide a design circuit for antenna impedance matching, including a load circuit, a filter circuit 10 and a matching circuit 20 connected to each other. The load circuit is connected to the filter circuit 10 at its end for connecting to an NFC chip. The matching circuit 20 includes a plurality of capacitors.

According to the antenna impedance matching design circuit provided by this disclosure, the load circuit is connected between the signal transmitting end of the NFC chip and the filter circuit 10. This solution can solve the impedance matching problem of an antenna 30 with high impedance, thereby optimizing the reflection coefficient of the design circuit while satisfying the forward transmission coefficient and achieving the best matching degree for the antenna 30.

Each component of the NFC circuit system according to some embodiments of this disclosure will be described in detail below with reference to the accompanying drawings.

As shown in FIG. 1 and FIG. 2, the antenna impedance matching design circuit provided by this disclosure is suitable for circuit design of the antenna 30 integrated in a display screen.

With the development of display technology, consumers have higher and higher requirements for electronic devices, such as higher resolution, narrower bezels, and more functions, such as NFC. Currently, in order to meet consumer demands for NFC and narrower bezels, NFC antennas are usually integrated into the display. However, due to limitations in the wiring space and winding range within the screen, the integrated antenna has a large impedance. The antenna impedance matching design circuit provided in this application is suitable for the circuit design of this kind of antenna integrated in the screen.

The antenna impedance matching design circuit provided by this disclosure may be connected between the signal transmitting end of the NFC chip and the antenna 30, and is configured to adjust impedance matching of the antenna 30 in such a manner that the signal source impedance and the load impedance achieve conjugate matching. The design circuit includes the load circuit, the filter circuit 10 and the matching circuit 20 that are connected to each other. The load circuit is connected to the filter circuit 10 at its end used for being connected to the NFC chip. The matching circuit 20 includes a plurality of capacitors.

In some embodiments of this disclosure, the load circuit and the filter circuit are connected in series. The load circuit includes a first resistor R1 and a second resistor R2. The first end of the first resistor R1 is configured to be connected to the signal transmitting end of the NFC chip, and the second end of the first resistor R1 is connected to the filter circuit 10. The first end of the second resistor R2 is configured to be connected to the signal transmitting end of the NFC chip, and the second end of the second resistor R2 is connected to the filter circuit 10.

The filter circuit 10 is a low-pass filter circuit 10, which allows low-frequency signals to pass normally, while blocking and weakening high-frequency signals exceeding a set threshold. The NFC chip is based on an operating frequency of 13.56 MHz, with the frequency being generated by a quartz crystal oscillator which may also generate high-order harmonics. In order to comply with internal electromagnetic compatibility rules, the generated higher-order harmonics can be blocked or attenuated by the filter circuit 10.

Still referring to FIG. 1 and FIG. 2, in some embodiments of this disclosure, the filter circuit 10 includes a first inductor L1, a first capacitor C1, a second inductor L2 and a second capacitor C2. The first end of the first inductor L1 is connected to the second end of the first resistor R1, the second end of the first inductor L1 is connected to the first end of the first capacitor C1; the first end of the second inductor L2 is connected to the second end of the second resistor R2, the second end of the second inductor L2 is connected to the first end of the second capacitor C2; and the second end of the first capacitor C1 is connected to the second end of the second capacitor C2 before being connected to the ground.

The matching circuit 20 is mainly used to perform impedance matching with the antenna 30 when the frequency of the antenna 30 is within the operating frequency range. In some embodiments of this disclosure, the matching circuit 20 includes a third capacitor C3, a fourth capacitor C4, a fifth capacitor C5 and a sixth capacitor C6. The first end of the third capacitor C3 is connected to the first end of the first capacitor C1, and the second end of the third capacitor C3 is connected to the first end of the fifth capacitor C5. The first end of the fourth capacitor C4 is connected to the first end of the second capacitor C2, and the second end of the fourth capacitor C4 is connected to the first end of the sixth capacitor C6. The second end of the fifth capacitor C5 is connected to the second end of the sixth capacitor C6, and is connected to the second end of the first capacitor C1. The first end of the fifth capacitor C5 and the first end of sixth capacitor C6 is configured to be connected with the antenna. Specifically, the first end of the antenna 30 may be connected to the first end of the fifth capacitor C5, and the second end of the antenna 30 may be connected to the first end of the sixth capacitor C6.

As shown in FIG. 1 and FIG. 2, this disclosure also provides an NFC circuit system, including an antenna 30, an NFC chip circuit and the design circuit in any of the above embodiments. The NFC chip circuit includes the NFC chip. The design circuit is connected between the signal transmitting end of the NFC chip and the antenna 30, and is configured to adjust impedance matching for the antenna. The load circuit is connected between the signal transmitting end of the NFC chip and the filter circuit 10.

The NFC chip circuit includes the NFC chip. The NFC chip is based on a short-distance, high-frequency wireless communication technology, it may have mutual communication functions and computing capabilities, can realize non-contact point-to-point communication (within 10 cm) data transmission between electronic devices for data exchanging, and is compatible with RFID (Radio Frequency Identification). In practical applications, by combining the functions of a proximity card reader, a proximity card and point-to-point function on a single NFC chip, it can perform identification and data exchanging with compatible devices within a short distance. The radio frequency signal generated by the NFC chip is transmitted to the antenna 30 through the design circuit.

The antenna 30 is an NFC antenna. The antenna 30 may be implemented, based on RFID technology, by means of a hardware processing solution using transformer co-coupling matching for communication, and complete the verification of data transmission process through instruction communication of a processor. Its software and hardware environment are subject to RFID modulation processing, and successfully designed and manufactured through adjustment of a matching circuit. In some embodiments, the antenna 30 may be composed of a circuit coil produced by winding, printing, and etching processes and a ferrite material with anti-interference capability.

The load circuit is connected in series between the signal transmitting end of the NFC chip and the filter circuit 10. The signal transmitting end of the NFC chip includes a first signal transmitting end Tx1 and a second signal transmitting end Tx2. The load circuit includes a first resistor R1 and a second resistor R2. The first end of the first resistor R1 is connected to the first signal transmitting end Tx1, and the second end of the first resistor R1 is connected to the filter circuit 10. The first end of the second resistor R2 is connected to the second signal transmitting end Tx2, and the second end of the second resistor R2 is connected to the filter circuit 10. In some embodiments, the resistance values of the first resistor R1 and the second resistor R2 are equal.

In some embodiments of this disclosure, the NFC chip circuit further includes a receiving circuit, and the receiving circuit is connected between the signal receiving end of the NFC chip and the antenna 30. The receiving circuit is used to optimize the receiving voltage of the NFC chip.

The signal receiving end includes a first signal receiving end Rxp and a second signal receiving end Rxn. The receiving circuit includes a seventh capacitor C7, an eighth capacitor C8, a third resistor R3 and a fourth resistor R4. The first end of the seventh capacitor C7 is connected to the first signal receiving end Rxp, and the second end of the seventh capacitor C7 is connected to the first end of the third resistor R3. The first end of the eighth capacitor C8 is connected to the second signal receiving end Rxn, and the second end of the eighth capacitor C8 is connected to the first end of the fourth resistor R4. The second end of the third resistor R3 is connected to the first end of the antenna 30, and the second end of the fourth resistor R4 is connected to the second end of the antenna 30.

The NFC circuit system provided by this disclosure may adopt double-ended matching. Alternatively, single-ended matching may also be adopted, which is not specifically limited in this disclosure.

In some embodiments of this disclosure, the NFC chip, the load circuit and the filter circuit 10 form the first circuit 1, and the antenna 30 and the matching circuit 20 form the second circuit 2. The first single-ended impedance of the first circuit 1 and the second single-ended impedance of second circuit 2 are conjugate impedances.

In this disclosure, the first single-ended impedance of the first circuit 1 refers to the impedance of a single-ended equivalent circuit of the first circuit 1. In the first circuit 1, the resistance values of the first resistor R1 and the second resistor R2 are equal, the inductance values of the first inductor L1 and the second inductor L2 are equal, and the capacitance values of the first capacitor C1 and the second capacitor C2 are equal.

The above-mentioned single-ended equivalent circuit of the first circuit 1 may be understood as a circuit in which half of a resistance required at the signal transmitting end of the NFC chip, the first resistor R1 and the first inductor L1 are connected in series, and the first capacitor C1 is connected in parallel at both ends of the series-connected circuit consisting of the half of the resistance required at the signal transmitting end of the NFC chip, the first resistor R1 and the first inductor L1. The first single-ended impedance of the first circuit 1 satisfies the following equation:

$$Z_{tr} = \frac{\left(\frac{R_{match}}{2} + R_{1,2}\right) + j\omega L_{1,2}) \cdot \left(-j\frac{1}{\omega C_{1,2}}\right)}{\left(\frac{R_{match}}{2} + R_{1,2}\right) + j\left(\omega L_{1,2} - \frac{1}{\omega C_{1,2}}\right)}$$

Herein, $Z_{tr}$ denotes the first single-ended impedance; $R_{match}$ denotes the resistance value required by the signal transmitting end of the NFC chip; $R_{1,2}$ denotes the resistance value of the first resistor or the second resistor; j denotes an imaginary unit; $\omega$ denotes an angular frequency; $C_{1,2}$ denotes the capacitance value of the first capacitor or the second capacitor; and $L_{1,2}$ denotes the inductance value of the first inductor or the second inductor.

In the above equation, the resistance values $R_{1,2}$ of the first resistor R1 and the second resistor R2 may be selected based on experience, and its selection range may be 1-15Ω, specifically 1Ω, 2Ω, 3Ω, 4Ω, 5Ω, 6Ω, 7Ω, 8Ω, 9Ω, 10Ω, 11Ω, 12Ω, 13Ω, 14Ω or 15Ω.

The inductance value $L_{1,2}$ of the first inductor L1 and the second inductor L2 may be selected according to the actual situation, and generally may be selected from tens of nanohenries (nH) to hundreds of nanohenries (nH).

The capacitance value $C_{1,2}$ of the first capacitor C1 and the second capacitor C2 may be calculated according to a resonant frequency range off-15.5 MHz-17 MHz. The calculation formula may be as follows:

$$C_{1,2} = \frac{1}{(2 \cdot \pi \cdot f)^2 L_{1,2}}$$

In this disclosure, the second single-ended impedance of the second circuit 2 refers to the impedance of a single-ended equivalent circuit of the second circuit 2. In the second circuit 2, the capacitance values of the third capacitor C3 and the fourth capacitor C4 are equal, and the capacitance values of the fifth capacitor C5 and the sixth capacitor C6 are equal.

The above-mentioned single-ended equivalent circuit of the second circuit 2 may be understood as a circuit in which a resistor and an inductor corresponding to half of an equivalent impedance at the antenna 30 end (or referred to as end(s) of antenna 30) are connected in series, and the fifth capacitor C5 is connected in parallel with a capacitor corresponding to half of the equivalent impedance at the antenna 30 end before being connected in series with the third capacitor C3. Herein, an equivalent capacitance of the circuit, where the fifth capacitor C5 is connected in parallel with the capacitor corresponding to half of the equivalent impedance at the antenna 30 end before being connected in series with the third capacitor C3, satisfies the following equation:

$$C_0 = \frac{C_{3,4}(C_{5,6} + C_{pa})}{C_{3,4} + C_{5,6} + C_{pa}}$$

The second single-ended impedance satisfies the following equation:

$$Z_{tr}^* = \frac{(R_{pa} + j\omega L_{pa}) \cdot \left(-j\dfrac{1}{\omega C_0}\right)}{R_{pa} + j\left(\omega L_{pa} - \dfrac{1}{\omega C_0}\right)}$$

Herein, $Z_{tr}^*$ denotes the second single-ended impedance; $R_{pa}$ denotes the resistance value corresponding to half of the antenna(30)-end equivalent impedance value; $L_{pa}$ denotes the inductance value corresponding to half of the antenna (30)-end equivalent impedance value; $C_{pa}$ denotes the capacitance value corresponding to half of the antenna(30)-end equivalent impedance value; $C_{3,4}$ denotes the capacitance value of the third capacitor or the fourth capacitor; $C_{5,6}$ denotes the capacitance value of the fifth capacitor or the sixth capacitor.

Figure 6:
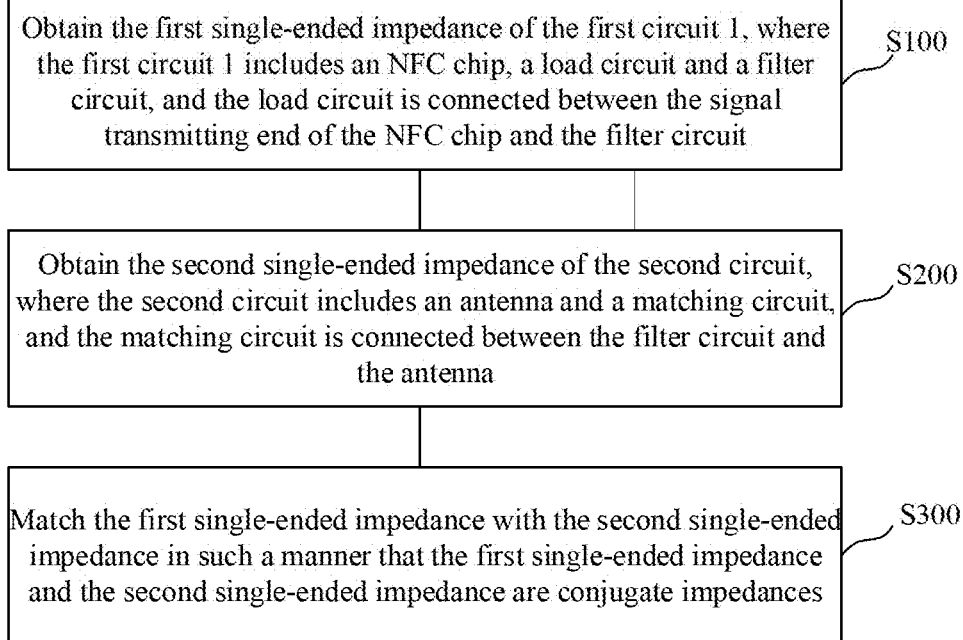
FIG. 6 is a flow chart of an NFC impedance matching method according to some embodiments of this disclosure.

As shown in FIG. 1, FIG. 2 and FIG. 6, this disclosure also provides an NFC impedance matching method, which includes the following content.

In step S100, the first single-ended impedance of the first circuit 1 is obtained. The first circuit 1 includes an NFC chip, a load circuit and a filter circuit 10. The load circuit is connected between the signal transmitting end of the NFC chip and the filter circuit 10.

In step S200, the second single-ended impedance of the second circuit 2 is obtained. The second circuit 2 includes an antenna 30 and a matching circuit 20. The matching circuit 20 is connected between the filter circuit 10 and the antenna 30.

In step S300, the first single-ended impedance and the second single-ended impedance are matched in such a manner that the first single-ended impedance and the second single-ended impedance are conjugate impedances.

In this disclosure, the NFC impedance matching method can be applied to the NFC circuit system in any of the above embodiments.

As shown in FIG. 2 and FIG. 6, in step S100, the first single-ended impedance of the first circuit 1 is obtained. The first circuit 1 includes the NFC chip, the load circuit and the filter circuit 10. The load circuit is connected between the signal transmitting end of the NFC chip and the filter circuit 10.

In this step, the signal transmitting end includes the first signal transmitting end Tx1 and the second signal transmitting end Tx2. The load circuit includes the first resistor R1 and the second resistor R2. The first end of the first resistor R1 is connected to the first signal transmitting end Tx1, and the second end of the first resistor R1 is connected to the filter circuit 10. The first end of the second resistor R2 is connected to the second signal transmitting end Tx2, and the second end of the second resistor R2 is connected to the filter circuit 10.

The filter circuit 10 includes a first inductor L1, a first capacitor C1, a second inductor L2 and a second capacitor C2. The first end of the first inductor L1 is connected to the second end of the first resistor R1, and the second end of the first inductor L1 is connected to the first end of the first capacitor C1. The first end of the second inductor L2 is connected to the second end of the second resistor R2, and the second end of the second inductor L2 is connected to the first end of the second capacitor C2. The second end of the first capacitor C1 is connected to the second end of the second capacitor C2 before being connected to the ground.

The NFC impedance matching method provided by this disclosure adopts double-end matching. Alternatively, single-ended matching may also be used, which is not specifically limited in this disclosure.

In this disclosure, the first single-ended impedance of the first circuit 1 refers to the impedance of a single-ended equivalent circuit of the first circuit 1. In the first circuit 1, the resistance values of the first resistor R1 and the second resistor R2 are equal, the inductance values of the first inductor L1 and the second inductor L2 are equal, and the capacitance values of the first capacitor C1 and the second capacitor C2 are equal.

The above-mentioned single-ended equivalent circuit of the first circuit 1 may be understood as a circuit in which half of a resistance required at the signal transmitting end of the NFC chip, the first resistor R1 and the first inductor L1 are connected in series, and the first capacitor C1 is connected in parallel at both ends of the series-connected circuit consisting of the half of the resistance required at the signal transmitting end of the NFC chip, the first resistor R1 and the first inductor L1. The first single-ended impedance of the first circuit 1 satisfies the following equation:

$$Z_{tr} = \frac{\left(\dfrac{R_{match}}{2} + R_{1,2}\right) + j\omega L_{1,2}) \cdot \left(-j\dfrac{1}{\omega C_{1,2}}\right)}{\left(\dfrac{R_{match}}{2} + R_{1,2}\right) + j\left(\omega L_{1,2} - \dfrac{1}{\omega C_{1,2}}\right)}$$

Herein, $Z_{tr}$ denotes the first single-ended impedance; $R_{match}$ denotes the resistance value required by the signal transmitting end of the NFC chip; $R_{1,2}$ denotes the resistance value of the first resistor or the second resistor; j denotes an imaginary unit; $\omega$ denotes an angular frequency; $C_{1,2}$ denotes the capacitance value of the first capacitor or the second capacitor; and $L_{1,2}$ denotes the inductance value of the first inductor or the second inductor.

In the above equation, the resistance values $R_{1,2}$ of the first resistor R1 and the second resistor R2 may be selected based on experience, and its selection range may be 1-15Ω, specifically 1Ω, 2Ω, 3Ω, 4Ω, 5Ω, 6Ω, 7Ω, 8Ω, 9Ω, 10Ω, 11, 12Ω, 13Ω, 14Ω or 15Ω.

The inductance value $L_{1,2}$ of the first inductor L1 and the second inductor L2 may be selected according to the actual situation, and generally may be selected from tens of nanohenries (nH) to hundreds of nanohenries (nH).

The capacitance value $C_{1,2}$ of the first capacitor C1 and the second capacitor C2 may be calculated according to a resonant frequency range of f=15.5 MHz~17 MHz. The calculation formula may be as follows:

$$C_{1,2} = \frac{1}{(2 \cdot \pi \cdot f)^2 L_{1,2}}$$

In step S200, the second single-ended impedance of the second circuit 2 is obtained. The second circuit 2 includes the antenna 30 and the matching circuit 20. The matching circuit 20 is connected between the filter circuit 10 and the antenna 30.

In this step, the matching circuit 20 includes a third capacitor C3, a fourth capacitor C4, a fifth capacitor C5 and a sixth capacitor C6. The first end of the third capacitor C3 is connected to the first end of the first capacitor C1, and the second end of the third capacitor C3 is connected to the first end of the fifth capacitor C5. The first end of the fourth capacitor C4 is connected to the first end of the second capacitor C2, and the second end of the fourth capacitor C4 is connected to the first end of the sixth capacitor C6. The second end of the fifth capacitor C5 is connected to the second end of the sixth capacitor C6, and is connected to the second end of the first capacitor C1. The first end of the antenna 30 is connected to the first end of the fifth capacitor C5, and the second end of the antenna 30 is connected to the first end of the sixth capacitor C6.

In this disclosure, the second single-ended impedance of the second circuit 2 refers to the impedance of a single-ended equivalent circuit of the second circuit 2. In the second circuit 2, the capacitance values of the third capacitor C3 and the fourth capacitor C4 are equal, and the capacitance values of the fifth capacitor C5 and the sixth capacitor C6 are equal.

The above-mentioned single-ended equivalent circuit of the second circuit 2 may be understood as a circuit in which a resistor and an inductor corresponding to half of an equivalent impedance at the antenna 30 end are connected in series, and the fifth capacitor C5 is connected in parallel with a capacitor corresponding to half of the equivalent impedance at the antenna 30 end before being connected in series with the third capacitor C3. Herein, an equivalent capacitance of the circuit, where the fifth capacitor C5 is connected in parallel with the capacitor corresponding to half of the equivalent impedance at the antenna 30 end before being connected in series with the third capacitor C3, satisfies the following equation:

$$C_0 = \frac{C_{3,4}(C_{5,6} + C_{pa})}{C_{3,4} + C_{5,6} + C_{pa}}$$

The second single-ended impedance satisfies the following equation:

$$Z_{tr}^* = \frac{(R_{pa} + j\omega L_{pa}) \cdot \left(-j\frac{1}{\omega C_0}\right)}{R_{pa} + j\left(\omega L_{pa} - \frac{1}{\omega C_0}\right)}$$

Herein, $Z_{tr}^*$ denotes the second single-ended impedance; $R_{pa}$ denotes the resistance value corresponding to half of the antenna(30)-end equivalent impedance value; $L_{pa}$ denotes the inductance value corresponding to half of the antenna (30)-end equivalent impedance value; $C_{pa}$ denotes the capacitance value corresponding to half of the antenna(30)-end equivalent impedance value; $C_{3,4}$ denotes the capacitance value of the third capacitor or the fourth capacitor; $C_{5,6}$ denotes the capacitance value of the fifth capacitor or the sixth capacitor.

In step S300, the first single-ended impedance and the second single-ended impedance are matched in such a manner that the first single-ended impedance and the second single-ended impedance are conjugate impedances.

In this step, the first single-ended impedance and the second single-ended impedance are conjugate impedances, and satisfy the following relationship:

$$Z_{tr} = R_{tr} + jX_{tr}$$

$$Z_{tr}^* = R_{tr} - jX_{tr}$$

In step S100, the first single-ended impedance of the first circuit 1 satisfies the following equation:

$$Z_{tr} = \frac{\left(\frac{R_{match}}{2} + R_{1,2}\right) + j\omega L_{1,2}) \cdot \left(-j\frac{1}{\omega C_{1,2}}\right)}{\left(\frac{R_{match}}{2} + R_{1,2}\right) + j\left(\omega L_{1,2} - \frac{1}{\omega C_{1,2}}\right)}$$

According to the conjugate relationship, the second single-ended impedance of the second circuit 2 is:

$$Z_{tr}^* = \frac{R_{match}}{2} + R_{1,2} - j\left(\omega L_{1,2} - \frac{1}{\omega C_{1,2}}\right)$$

The solution to the above equation is:

$$R_{tr} = \frac{R_{match} + R_{1,2}}{\left(1 - \omega^2 \cdot L_{1,2} \cdot C_{1,2}\right)^2 + \left(\omega \cdot \left(\frac{R_{match}}{2} + R_{1,2}\right) \cdot C_{1,2}\right)^2}$$

$$X_{tr} = 2 \cdot \omega \cdot \frac{L_{1,2}\left(1 - \omega^2 \cdot L_{1,2} \cdot C_{1,2}\right) - \left(\frac{R_{match}}{2} + R_{1,2}\right)^2 \cdot C_{1,2}}{\left(1 - \omega^2 \cdot L_{1,2} \cdot C_{1,2}\right)^2 \left(\omega \cdot \left(\frac{R_{match}}{2} + R_{1,2}\right) \cdot C_{1,2}\right)^2}$$

The capacitance value $C_{3,4}$ of the third capacitor C3 and the fourth capacitor C4 in the matching circuit 20, and the capacitance value $C_{5,6}$ of the fifth capacitor C5 and the sixth capacitor C6 are calculated as:

$$C_{3,4} \approx \frac{1}{\omega \cdot \left(\sqrt{\frac{R_{tr} \cdot R_{pa}}{4}} + \frac{X_{tr}}{2}\right)}$$

$$C_{5,6} \approx \frac{1}{\omega \cdot \frac{L_{pa}}{2}} - \frac{1}{\omega \cdot \sqrt{\frac{R_{tr} \cdot R_{pa}}{4}}} - 2 \cdot C_{pa}$$

In some embodiments of this disclosure, impedance matching and simulation may also be performed by means of the Smith chart tool.

As shown in FIG. 1 and FIG. 7, an NFC impedance matching method includes the following content.

In step S10, when performing impedance matching by means of a Smith chart, an equivalent impedance value at an antenna 30 end is configured as a starting impedance point, and an impedance value required by the NFC chip is configured as a matching point.

In step S20, matching is started from the antenna 30 end, multiple capacitors and multiple inductors are added, causing the starting impedance point to move along an impedance circle or an admittance circle in the Smith chart to obtain a moving impedance point.

In step S30, a load circuit is added, causing the moving impedance point to move along a real axis of the Smith chart up to the matching point.

In some embodiments of this disclosure, step S20 includes:

adding a fifth capacitor C5, causing the starting impedance point to rotate clockwise along a constant admittance circle to a first moving impedance point;

adding a third capacitor C3, causing the first moving impedance point to rotate counterclockwise along a constant impedance circle to a second moving impedance point;

adding a first capacitor C1, causing the second moving impedance point to rotate clockwise along the constant admittance circle to a third moving impedance point; and adding a first inductor L1, causing the third moving impedance point to rotate clockwise along the constant impedance circle to the moving impedance point.

In some embodiments of this disclosure, upon adding the load circuit, the moving impedance point moves along a circle with low constant impedance toward a circle with high impedance.

The following will describe the test results of the impedance matching scheme in the related art and the impedance matching scheme in the disclosure using the Smith chart tool in conjunction with specific embodiments.

When using the Smith chart tool for impedance matching, the equivalent impedance at the end of the antenna 30 is set as the starting impedance point, that is the Z-load point in the drawings; the impedance value Zmatch required by the NFC chip is set as the Z-source point, that is the matching point. Then matching is started from the load end (antenna 30 end), and respective devices are added in the design circuit in sequence. The device parameters may be set based on empirical values. As the devices are added, the Z-load point begins to move, and the moving impedance point is obtained. According to the position of the moving impedance point in the Smith chart, the device parameters are adjusted according to the above rules, and finally the impedance value is matched to the Z-source. Based on a normalization processing, the matching point is (1, 0), the open-circuited point is (∞, ∞), and short-circuited point is (0, 0) in Smith chart.

Figure 3:
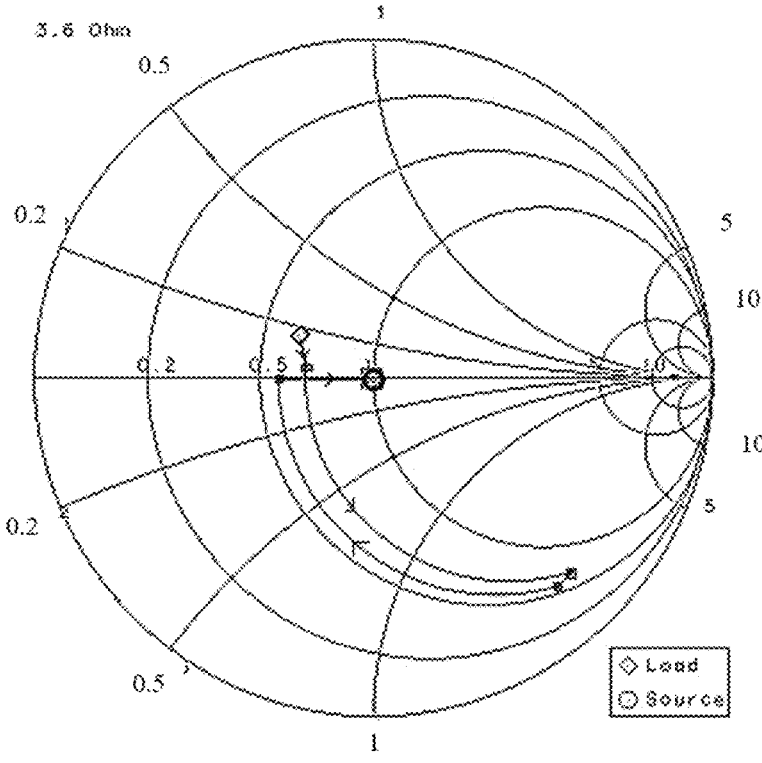
FIG. 3 is a Smith chart of antenna impedance matching according to some embodiments of this disclosure.

As shown in FIG. 3, in the Smith chart, the upper semicircle impedance is inductive reactance, the lower semicircle impedance is capacitive reactance, the real axis is pure resistance, and the unit circle is pure reactance. The impedance circle is a circle in the drawing, with the right endpoint of the real axis as the starting point, whose radius gradually increases from right to left. The admittance circle is a circle in the drawing, with the left endpoint of the real axis as the starting point, whose radius gradually increases from left to right. It should be noted here that, for the sake of clarity, the admittance circle is not shown in FIG. 4.

When adding inductance, capacitance, and resistance to the initial impedance Z, the impedance point on the Smith chart rotates according to the following rules.

Series inductance: the impedance Z rotates clockwise along the constant impedance circle, with the arc length of rotation depending on the inductance value.

Series capacitor: the impedance Z rotates counterclockwise along the constant impedance circle, with the arc length of rotation depending on the capacitance value.

Parallel inductance: the impedance Z rotates counterclockwise along the constant admittance circle, with the arc length of rotation depending on the inductance value.

Parallel capacitor: the impedance Z rotates clockwise along the constant admittance circle, with the arc length of rotation depending on the capacitance value.

Series resistance: the impedance Z varies from a circle with low constant impedance to a circle with high impedance, with the variation distance depending on the resistance value.

Parallel resistance: the impedance Z varies from a circle with high constant impedance to a circle with low impedance, with the variation distance depending on the resistance value.

Based on the antenna impedance matching design circuit, as shown in FIG. 1 and FIG. 3, the first resistor R1 and the second resistor R2 are connected in series between the signal transmitting end of the NFC chip and the filter circuit 10. The equivalent impedance at end of the antenna 30, that is, the initial impedance, is set to the Z-load point, and the Zmatch required by the NFC chip is set to Z-source. Then matching is started from the load end (antenna 30 end).

As shown in FIG. 1 and FIG. 3, taking the single-ended circuit as an example, starting from the load end (antenna 30 end), when the fifth capacitor C5 is added to the Z-load, the fifth capacitor C5 is connected in parallel with the antenna 30 end, and the impedance Z rotates clockwise along the constant admittance circle, with the arc length of rotation depending on the capacitance value. Then a third capacitor C3 is added, and the third capacitor C3 is connected in series. The impedance Z rotates counterclockwise along the constant impedance circle, with the arc length of rotation depending on the capacitance value. Then the first capacitor C1 is added, and the first capacitor C1 is connected in parallel. The impedance Z rotates clockwise along the constant admittance circle, with the arc length of rotation depending on the capacitance value. Then the first inductor L1 is added, and the first inductor L1 is connected in series. The impedance Z rotates clockwise along the constant impedance circle, with the arc length of rotation depending on the inductance value. Finally, the first resistor R1 is added, and the first resistor R1 is connected in series. The impedance Z varies along the circle with low constant impedance toward the circle with high impedance, with the variation distance depending on the resistance value. As can be seen from FIG. 5, when the matching is completed, the impedance Z can be matched to the Z-source point.

Figure 4:
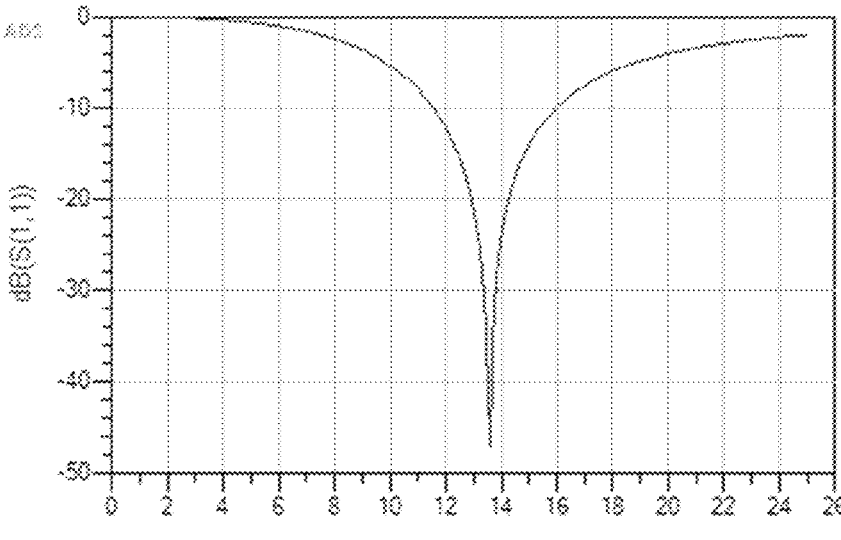
FIG. 4 is an S11 simulation diagram of antenna impedance matching according to some embodiments of this disclosure.
Figure 5:
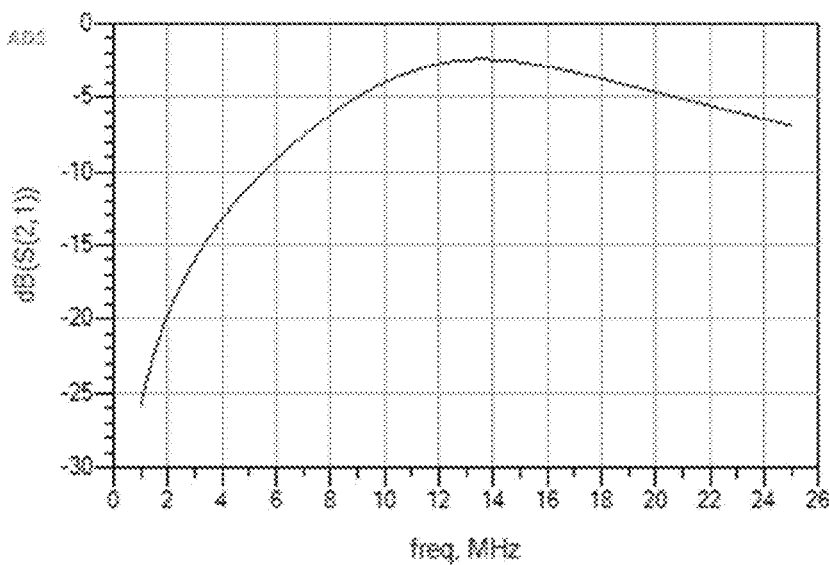
FIG. 5 is an S21 simulation diagram of antenna impedance matching according to some embodiments of this disclosure.

The simulation results are shown in FIG. 4 and FIG. 5. In FIG. 4, the abscissa is frequency, and the ordinate is Y (dB)=20 log X, where X is the reflection coefficient. FIG. 4 shows the S11 simulation result of the disclosed solution. S11 indicates the reflection coefficient of port 1 (signal transmitting end of NFC chip) when port 2 (antenna 30 end) is connected and matched. The smaller the reflection coefficient value, the better, and it is generally recommended to be <0.1, that is, −20 dB. In the simulation result of FIG. 4, when the frequency is 13.56 MHz, the ordinate is −42 dB, thereby meeting the requirements.

In FIG. 5, the abscissa is frequency, and the ordinate is Y (dB)=20 log X, where X is the forward transmission coefficient. FIG. 5 shows the S21 simulation result. S21 indicates the forward transmission coefficient from port 1 (signal transmitting end of NFC chip) to port 2 (antenna 30 end) when port 2 (antenna 30 end) is connected and matched. Its ideal value is 1, and it is generally recommended to be >0.7, that is, −3 dB. In the simulation result of FIG. 5, it is −2.3 dB, thereby meeting the requirements.

It can be seen from the above results that the disclosed solution can solve the impedance matching problem of the antenna 30 with high impedance, thereby optimizing the reflection coefficient of the design circuit while satisfying the forward transmission coefficient and achieving the best matching degree for the antenna.

This disclosure also provides a display device that integrates an NFC antenna, that is, the antenna 30 according to any of the above embodiments, into a display screen. The display device of this disclosure may be an electronic device such as a mobile phone, a tablet computer, or a television, which will not be elaborated here.

It should be noted that although the various steps of the method in this disclosure are described in a specific order in the drawings, this does not require or imply that, in order to achieve the desired results, these steps must be performed in this specific order, or that all of the steps shown must be performed. Additionally or alternatively, certain steps may be omitted, multiple steps may be combined into one step for execution, and/or one step may be decomposed into multiple steps for execution, and the like, all of such modifications shall be considered part of this disclosure.

It should be understood that this disclosure is not intended to limit its application to the detailed structure and arrangement of components set forth in this specification. The disclosure can be embodied in other embodiments, and can be implemented and carried out in various ways. The aforementioned variations and modifications fall within the scope of this disclosure. It will be understood that the disclosure disclosed and defined in this specification extends to all alternative combinations of two or more individual features mentioned or apparent in the text and/or drawings. All of these different combinations constitute alternative aspects of the disclosure. The detailed description describes the best mode known for carrying out the disclosure, and will enable those skilled in the art to utilize the disclosure.

What is claimed is:

1. An antenna impedance matching design circuit, comprising a load circuit, a filter circuit and a matching circuit connected to each other, wherein the load circuit is connected to an end of the filter circuit for connecting to a near field communication (NFC) chip, and the matching circuit comprises a plurality of capacitors;

wherein the load circuit comprises a first resistor and a second resistor; a first end of the first resistor is configured to be connected to a signal transmitting end of the NFC chip, and a second end of the first resistor is connected to the filter circuit; a first end of the second resistor is configured to be connected to the signal transmitting end of the NFC chip, and a second end of the second resistor is connected to the filter circuit;

the filter circuit comprises a first inductor, a first capacitor, a second inductor and a second capacitor; a first end of the first inductor is connected to the second end of the first resistor, and a second end of the first inductor is connected to a first end of the first capacitor; a first end of the second inductor is connected to the second end of the second resistor, and a second end of the second inductor is connected to a first end of the second capacitor; a second end of the first capacitor is connected to a second end of the second capacitor and then connected to ground;

wherein a resistance value of the first resistor is equal to a resistance value of the second resistor, an inductance value of the first inductor is equal to an inductance value of the second inductor, and a capacitance value of the first capacitor is equal to a capacitance value of the second capacitor;

the first single-ended impedance of the first circuit satisfies a following equation:

$$ Z_{tr} = \frac{\left(\dfrac{R_{match}}{2} + R_{1,2}\right) + j\omega L_{1,2}\right) \cdot \left(-j\dfrac{1}{\omega C_{1,2}}\right)}{\left(\dfrac{R_{match}}{2} + R_{1,2}\right) + j\left(\omega L_{1,2} - \dfrac{1}{\omega C_{1,2}}\right)} $$

where $Z_{tr}$ denotes the first single-ended impedance; $R_{match}$ denotes a resistance value required by the signal transmitting end of the NFC chip; $R_{1,2}$ denotes the resistance value of the first resistor or the second resistor; j denotes an imaginary unit; w denotes an angular frequency; $C_{1,2}$ denotes the capacitance value of the first capacitor or the second capacitor; and $L_{1,2}$ denotes the inductance value of the first inductor or the second inductor.

2. The antenna impedance matching design circuit according to claim 1, wherein the load circuit and the filter circuit are connected in series.

3. The antenna impedance matching design circuit according to claim 1, wherein the matching circuit comprises a third capacitor, a fourth capacitor, a fifth capacitor and a sixth capacitor;

a first end of the third capacitor is connected to the first end of the first capacitor, and a second end of the third capacitor is connected to a first end of the fifth capacitor;

a first end of the fourth capacitor is connected to the first end of the second capacitor, and a second end of the fourth capacitor is connected to a first end of the sixth capacitor;

a second end of the fifth capacitor is connected to a second end of the sixth capacitor and connected to the second end of the first capacitor;

the first end of the fifth capacitor and the first end of the sixth capacitor are configured to be connected to an antenna.

4. A near field communication (NFC) circuit system, comprising:

an antenna;

an NFC chip circuit comprising an NFC chip; and a design circuit, wherein the design circuit is connected between a signal transmitting end of the NFC chip and the antenna, and is configured to adjust impedance match for the antenna, wherein the design circuit comprises a load circuit, a filter circuit and a matching circuit connected to each other, the load circuit is connected to an end of the filter circuit for connecting to the NFC chip, and the matching circuit comprises a plurality of capacitors;

the load circuit is connected between the signal transmitting end of the NFC chip and the filter circuit;

wherein the load circuit comprises a first resistor and a second resistor; a first end of the first resistor is configured to be connected to the signal transmitting end of the NFC chip, and a second end of the first resistor is connected to the filter circuit; a first end of the second resistor is configured to be connected to the signal transmitting end of the NFC chip, and a second end of the second resistor is connected to the filter circuit;

the filter circuit comprises a first inductor, a first capacitor, a second inductor and a second capacitor; a first end of the first inductor is connected to the second end of the first resistor, and a second end of the first inductor is connected to a first end of the first capacitor; a first end of the second inductor is connected to the second end of the second resistor, and a second end of the second inductor is connected to a first end of the second capacitor; a second end of the first capacitor is connected to a second end of the second capacitor and then connected to ground;

wherein a resistance value of the first resistor is equal to a resistance value of the second resistor, an inductance value of the first inductor is equal to an inductance value of the second inductor, and a capacitance value of the first capacitor is equal to a capacitance value of the second capacitor;

the first single-ended impedance of the first circuit satisfies a following equation:

$$Z_{tr} = \frac{\left(\left(\frac{R_{match}}{2} + R_{1,2}\right) + j\omega L_{1,2}\right) \cdot \left(-j\frac{1}{\omega C_{1,2}}\right)}{\left(\frac{R_{matc}}{2} + R_{1,2}\right) + j\left(\omega L_{1,2} - \frac{1}{\omega C_{1,2}}\right)}$$

where $Z_{tr}$ denotes the first single-ended impedance; $R_{match}$ denotes a resistance value required by the signal transmitting end of the NFC chip; $R_{1,2}$ denotes the resistance value of the first resistor or the second resistor; j denotes an imaginary unit; $\omega$ denotes an angular frequency; $C_{1,2}$ denotes the capacitance value of the first capacitor or the second capacitor; and $L_{1,2}$ denotes the inductance value of the first inductor or the second inductor.

5. The NFC circuit system according to claim 4, wherein the signal transmitting end comprises a first signal transmitting end and a second signal transmitting end; and when the load circuit comprises the first resistor and the second resistor, the first end of the first resistor is connected to the first signal transmitting end, and the first end of the second resistor is connected to the second signal transmitting end.

6. The NFC circuit system according to claim 4, wherein the NFC chip circuit further comprises a receiving circuit, the receiving circuit is connected between a signal receiving end of the NFC chip and the antenna;

the signal receiving end comprises a first signal receiving end and a second signal receiving end;

the receiving circuit comprises a seventh capacitor, an eighth capacitor, a third resistor and a fourth resistor;

a first end of the seventh capacitor is connected to the first signal receiving end, and a second end of the seventh capacitor is connected to a first end of the third resistor;

a first end of the eighth capacitor is connected to the second signal receiving end, and a second end of the eighth capacitor is connected to a first end of the fourth resistor;

a second end of the third resistor is connected to a first end of the antenna, and a second end of the fourth resistor is connected to a second end of the antenna.

7. The NFC circuit system according to claim 4, wherein:

the matching circuit comprises a third capacitor, a fourth capacitor, a fifth capacitor and a sixth capacitor; a first end of the third capacitor is connected to the first end of the first capacitor, and a second end of the third capacitor is connected to a first end of the fifth capacitor; a first end of the fourth capacitor is connected to the first end of the second capacitor, and a second end of the fourth capacitor is connected to a first end of the sixth capacitor; a second end of the fifth capacitor is connected to a second end of the sixth capacitor and connected to the second end of the first capacitor; the first end of the fifth capacitor and the first end of the sixth capacitor are configured to be connected to an antenna;

wherein, the NFC chip, the load circuit and the filter circuit form a first circuit, and the antenna and the matching circuit form a second circuit;

a first single-ended impedance of the first circuit and a second single-ended impedance of the second circuit are conjugate impedances.

8. The NFC circuit system according to claim 4, wherein a capacitance value of the third capacitor is equal to a capacitance value of the fourth capacitor; a capacitance value of the fifth capacitor is equal to a capacitance value of the sixth capacitor;

the second single-ended impedance of the second circuit satisfies a following equation:

$$Z_{tr}^* = \frac{(R_{pa} + j\omega L_{pa}) \cdot \left(-j\frac{1}{\omega C_0}\right)}{R_{pa} + j\left(\omega L_{pa} - \frac{1}{\omega C_0}\right)}, \text{where } C_0 = \frac{C_{3,4}(C_{5,6} + C_{pa})}{C_{3,4} + C_{5,6} + C_{pa}};$$

$Z_{tr}^*$ denotes the second single-ended impedance; $R_{pa}$ denotes a resistance value corresponding to half of an antenna-end equivalent impedance value; $L_{pa}$ denotes an inductance value corresponding to half of the antenna-end equivalent impedance value; $C_{pa}$ denotes a capacitance value corresponding to half of the antenna-end equivalent impedance value; $C_{3,4}$ denotes the capacitance value of the third capacitor or the fourth capacitor; $C_{5,6}$ denotes the capacitance value of the fifth capacitor or the sixth capacitor.

9. A near field communication (NFC) impedance matching method, comprising:

obtaining a first single-ended impedance of a first circuit, wherein the first circuit comprises an NFC chip, a load circuit and a filter circuit, and the load circuit is connected between a signal transmitting end of the NFC chip and the filter circuit;

obtaining a second single-ended impedance of a second circuit, wherein the second circuit comprises an antenna and a matching circuit, and the matching circuit is connected between the filter circuit and the antenna;

matching the first single-ended impedance with the second single-ended impedance in such a manner that the first single-ended impedance and the second single-ended impedance are conjugate impedances;

wherein the load circuit comprises a first resistor and a second resistor: a first end of the first resistor is configured to be connected to the signal transmitting end of the NFC chip, and a second end of the first resistor is connected to the filter circuit; a first end of the second resistor is configured to be connected to the signal transmitting end of the NFC chip, and a second end of the second resistor is connected to the filter circuit;

the filter circuit comprises a first inductor, a first capacitor, a second inductor and a second capacitor; a first end of the first inductor is connected to the second end of the first resistor, and a second end of the first inductor is connected to a first end of the first capacitor; a first end of the second inductor is connected to the second end of the second resistor, and a second end of the second inductor is connected to a first end of the second capacitor; a second end of the first capacitor is connected to a second end of the second capacitor and then connected to ground;

wherein a resistance value of the first resistor is equal to a resistance value of the second resistor, an inductance value of the first inductor is equal to an inductance value of the second inductor, and a capacitance value of the first capacitor is equal to a capacitance value of the second capacitor;

the first single-ended impedance satisfies a following equation:

$$Z_{tr} = \frac{\left(\left(\frac{R_{match}}{2} + R_{1,2}\right) + j\omega L_{1,2}\right) \cdot \left(-j\frac{1}{\omega C_{1,2}}\right)}{\left(\frac{R_{match}}{2} + R_{1,2}\right) + j\left(\omega L_{1,2} - \frac{1}{\omega C_{1,2}}\right)}$$

where $Z_{tr}$ denotes the first single-ended impedance; $R_{match}$ denotes a resistance value required by the signal transmitting end of the NFC chip; $R_{1,2}$ denotes the resistance value of the first resistor or the second resistor; j denotes an imaginary unit; $\omega$ denotes an angular frequency; $C_{1,2}$ denotes the capacitance value of the first capacitor or the second capacitor; and $L_{1,2}$ denotes the inductance value of the first inductor or the second inductor.

10. The NFC impedance matching method according to claim 9, wherein the load circuit is connected in series between the signal transmitting end of the NFC chip and the filter circuit.

11. The NFC impedance matching method according to claim 9, wherein the signal transmitting end comprises a first signal transmitting end and a second signal transmitting end;

the first end of the first resistor is connected to the first signal transmitting end, and the second end of the first resistor is connected to the filter circuit;

the first end of the second resistor is connected to the second signal transmitting end, and the second end of the second resistor is connected to the filter circuit.

12. The NFC impedance matching method according to claim 9, wherein the matching circuit comprises a third capacitor, a fourth capacitor, a fifth capacitor and a sixth capacitor;

a first end of the third capacitor is connected to the first end of the first capacitor, and a second end of the third capacitor is connected to a first end of the fifth capacitor;

a first end of the fourth capacitor is connected to the first end of the second capacitor, and a second end of the fourth capacitor is connected to a first end of the sixth capacitor;

a second end of the fifth capacitor is connected to a second end of the sixth capacitor and connected to the second end of the first capacitor;

a first end of the antenna is connected to the first end of the fifth capacitor, and a second end of the antenna is connected to the first end of the sixth capacitor;

wherein, a capacitance value of the third capacitor is equal to a capacitance value of the fourth capacitor; a capacitance value of the fifth capacitor is equal to a capacitance value of the sixth capacitor; and the second single-ended impedance satisfies a following equation:

$$Z_{tr}^* = \frac{(R_{pa} + j\omega L_{pa}) \cdot \left(-j\frac{1}{\omega C_0}\right)}{R_{pa} + j\left(\omega L_{pa} - \frac{1}{\omega C_0}\right)} \text{ where}$$

$$C_0 = \frac{C_{3,4}(C_{5,6} + C_{pa})}{C_{3,4} + C_{5,6} + C_{pa}};$$

$Z_{tr}^*$ denotes the second single-ended impedance; $R_{pa}$ denotes a resistance value corresponding to half of an antenna-end equivalent impedance value; $L_{pa}$ denotes an inductance value corresponding to half of the antenna-end equivalent impedance value; $C_{pa}$ denotes a capacitance value corresponding to half of the antenna-end equivalent impedance value; $C_{3,4}$ denotes the capacitance value of the third capacitor or the fourth capacitor; $C_{5,6}$ denotes the capacitance value of the fifth capacitor or the sixth capacitor.

13. A display device comprising the NFC circuit system according to claim 4.

\* \* \* \* \*